(12) United States Patent
Caruyer et al.

(10) Patent No.: US 8,212,324 B2
(45) Date of Patent: Jul. 3, 2012

(54) MICRO-ELECTROMECHANICAL RESONANCE DEVICE WITH PERIODIC STRUCTURE

(75) Inventors: Gregory Caruyer, Goncelin (FR); Karim Segueni, Saint-Sauveur (FR); Pascal Ancey, Revel (FR); Bertrand Dubus, Ronchin (FR)

(73) Assignee: STMicroelectronics SA, Montrouge (FR)

( * ) Notice: Subject to any disclaimer, the term of this patent is extended or adjusted under 35 U.S.C. 154(b) by 563 days.

(21) Appl. No.: 12/419,125

(22) Filed: Apr. 6, 2009

(65) Prior Publication Data
US 2009/0289314 A1 Nov. 26, 2009

(30) Foreign Application Priority Data
Apr. 7, 2008 (FR) ..................................... 08 52316

(51) Int. Cl.
*H01L 29/84* (2006.01)
*H01L 21/00* (2006.01)
(52) U.S. Cl. ................... 257/415; 257/E29.324; 438/50
(58) Field of Classification Search .................. None
See application file for complete search history.

(56) References Cited

U.S. PATENT DOCUMENTS
2003/0117237 A1 6/2003 Niu et al. ...................... 333/197
2004/0075363 A1* 4/2004 Malkin et al. ................. 310/321

OTHER PUBLICATIONS

Hsu et al., "Q-Optimized Lateral Free-Free Beam Micromechanical Resonators", Digest of Technical Papers, 11$^{th}$ Int. Conf. on Solid State Sensors & Actuators (Transducers '01), Munich, Germany, Jun. 10-14, 2001, pp. 1110-1113.

* cited by examiner

*Primary Examiner* — Ha Tran T Nguyen
*Assistant Examiner* — Kevin Quinto
(74) *Attorney, Agent, or Firm* — Allen, Dyer, Doppelt, Milbrath & Gilchrist, P.A.

(57) ABSTRACT

A Micro Electro Mechanical Systems resonance device includes a substrate, and an input electrode, connected to an alternating current source having an input frequency. The device also includes an output electrode, and at least one anchoring structure, connected to the substrate. The device further includes a vibratile structure connected to an anchoring structure by at least one junction, having a natural acoustic resonant frequency. The vibration under the effect of the input electrode, when it is powered, generates, on the output electrode, an alternating current wherein the output frequency is equal to the natural frequency. The vibratile structure and/or the anchoring structure includes a periodic structure. The periodic structure includes at least first and second zones different from each other, and corresponding respectively to first and second acoustic propagation properties.

26 Claims, 2 Drawing Sheets

MICRO-ELECTROMECHANICAL RESONANCE DEVICE WITH PERIODIC STRUCTURE

FIELD OF THE INVENTION

The present invention relates to the field of micro-electromechanical resonance devices more commonly known as Micro Electro Mechanical Systems (MEMS).

BACKGROUND OF THE INVENTION

A MEMS is a device having dimensions that are micrometric or nanometric in scale. It is equipped with a resonant vibratile mechanical structure, according to the structure thereof, with a specific natural frequency. This mechanical resonant frequency is used, for example, for the manufacture of electronic components, such as resonators, which have an electric resonance equal to the mechanical resonance.

Resonators are used in resonant electronic circuits, applied, for example, to signal filtering, or frequency generator (Voltage Controlled Oscillator (VCO)) operations, for example, for the generation of a carrier in telephony. To obtain resonant electronic circuits, so-called LC circuits, combining an inductance L and a capacitance C, may conventionally be used. However, such circuits have the drawback of having relatively low quality coefficients and high phase noise. Therefore, MEMS are generally preferred to LC circuits as they have high quality factors.

Moreover, quartz resonators are generally known. These resonators have very good quality factors, but are discrete components and, as such, pose connection and cost problems for the use thereof with an integrated electronic circuit.

SUMMARY OF THE INVENTION

With the use of resonance devices, the problem includes obtaining a relatively monochromatic resonant frequency, and with respect to the electronic circuit including the resonance device, limiting the dynamic consumption, particularly by the highest possible quality factor.

In addition, more specifically, the present embodiments relate to a micro-electromechanical resonance device including a substrate, and an input electrode, connected to an alternating current input frequency source. The resonance device also includes an output electrode, at least one anchoring structure, connected to the substrate, and a vibratile structure, connected to an anchoring structure by at least one junction located on a vibration node of the vibratile structure, having a natural acoustic resonant frequency. The vibration under the effect of the input electrode when it is powered generates on the output electrode an alternating current, wherein the output frequency is equal to the natural frequency.

Such a device is known to those skilled in the art, particularly through the example given by the document according to the prior art, "Q-Optimized Lateral Free-Free Beam Micromechanical Resonators", W. -T. Hsu, J. R. Clark, and C. T. -C. Nguyen, Digest of Technical Papers, the 11$^{th}$ Int. Conf. on Solid-State Sensors & Actuators (Transducers'01), Munich, Germany, Jun. 10-14, 2001, pp. 1110-1113. Such a resonance device uses a vibratile structure in the form of a beam, wherein the ends are free and vibrating according to a lateral mode.

The beam is connected to the substrate by a double symmetry system, wherein four identical connection arms connect the beam to four anchors fixed in the substrate. The connection arms are liable to vibrate, located at either end of the beam and are connected thereon to vibration nodes thereof. The length of the connection arms is such that the junction points between the beam and the connection arms are also located at vibration nodes of the connection arms.

However, such a configuration involves, in any case, leakage and therefore dynamic consumption, and a very specific geometric configuration is desirable. The present embodiments provide an approach to this. Such an approach includes a device based on the principle similar to that of Bragg reflection.

In view of this object, the vibratile structure and/or the anchoring structure of the device includes a periodic structure. The periodic structure includes at least first and second zones different from each other, respectively having different first and second acoustic propagation properties. By this configuration, the acoustic signal is confined in the vibratile structure and the acoustic losses limited.

Indeed, the device creates "forbidden" frequency bands wherein the acoustic signal is not transmitted from the vibratile structure to the substrate, which limits the acoustic losses and, consequently, the consumption of the electronic circuit that includes the device. The acoustic contrast between the different zones of the periodic structure is generally maximal, i.e. the acoustic propagation properties are as different as possible from one zone to another.

The periodic structure is produced by periodic etching of the vibratile structure, or of the anchoring structure. The periodic structure may also be produced by periodic deposition of material on the vibratile structure, or on the anchoring structure. In the case of periodic deposition, the deposited material may be different from that forming the vibratile device, or the material of the anchoring structure.

The periodic structure is located in the vicinity of the junction between the vibratile structure and the anchoring structure. Advantageously, the dimensional features of the periodic structure are determined as a function of the natural frequency of the vibratile structure.

In one embodiment, the periodic structure is dimensioned as $\lambda/4$, where $\lambda$ is the wavelength corresponding to the acoustic wave propagation rate in the periodic structure for the resonant frequency fp, as described below. In another embodiment, the vibratile structure is a beam vibrating according to a lateral, vertical, torsion or extension mode.

In another embodiment, the vibratile structure is a disk connected at the center thereof to the anchoring structure. The periodic structure is concentric with the center of the disk. The periodic structure may be arranged perpendicularly to the direction of propagation of the acoustic wave in the vibratile structure, or in the anchoring structure.

The embodiments also relate to an integrated circuit including the resonance device as described. Other features and advantages of the present embodiments will be apparent by reading the following description given as an illustrative and non-limitative example, with reference to the appended figures wherein.

DETAILED DESCRIPTION OF THE PREFERRED EMBODIMENTS

Figure 1:
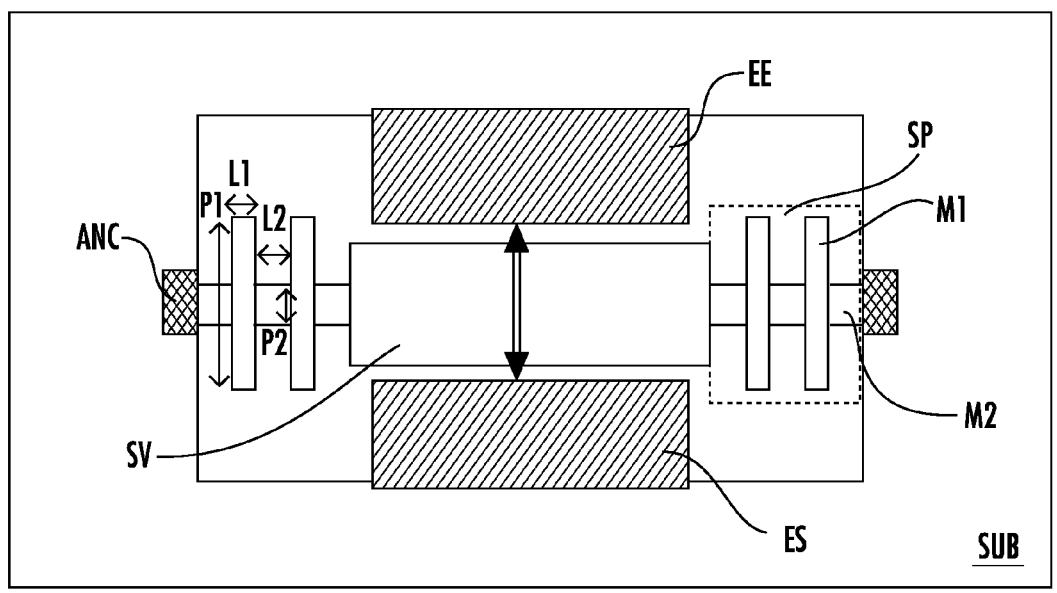
FIG. 1 is a top view of an embodiment of the device according to the invention.

A Micro Electro Mechanical Systems (MEMS) resonance device includes a vibratile structure SV, connected by an anchoring structure to a substrate SUB, and typically polarized by a direct current (DC) voltage. In embodiments of a MEMS, the vibratile structure is connected to an anchoring structure by at least one junction located on a vibration node of the vibratile structure. For example, the vibratile structure may be made of polysilicon, or have a monocrystalline structure, for example, Si on SiGe epitaxy. The advantage of a monocrystalline structure includes having lower elastic losses than those of a polycrystalline structure. The vibratile structure may also be made using an amorphous material, such as silicon nitride $Si_xN_y$, coated with an electrically conductive material, such as a metal.

An anchoring structure includes at least one anchor ANC fixed in the substrate and may include a connector ML (FIG. 3) to connect the anchor to the vibratile structure. The connector may be made of a different material from the material used for the vibratile structure. Similarly, the thickness of the connector may be different to that of the vibratile structure.

In some embodiments (not shown) the vibratile structure is connected to the substrate by a more complex structure that includes, for example, other vibratile structures. For clarity of the present description, relatively simple embodiments with a single vibratile structure are described hereinafter. However, such complex structures remain within the scope of the present embodiments.

An input electrode EE, connected in operation to an alternating current input frequency source fi, generates an electrostatic force which vibrates the vibratile structure at one of the natural frequencies fp thereof. This vibration generates a modulation of the capacitance between the vibratile structure and an output electrode ES, whereon a frequency output current equal to the natural frequency fp is created.

The vibratile structure and/or the anchoring structure includes a periodic structure. This periodic structure includes at least one first zone M1 and a second zone M2, different from each other, and corresponding respectively to first and second acoustic propagation properties. In other embodiments, the periodic structure may include a number of zones greater than or equal to three. However, for clarity of the present description, the embodiment wherein the periodic structure comprises two zones is described.

The periodic structure may form all or part of the anchoring structure. For example, it may form all or part of the connector between the anchor and the vibratile structure an/or all or part of the anchor. The periodic structure may be configured such that the incidence of the acoustic wave thereon is normal. When an acoustic wave is propagated in a periodic structure, in a manner similar to the electromagnetic waves in insulators or semi-conductors, the periodic structure, due to the periodicity thereof, modifies the dispersion relationships of the acoustic wave. The effect of such a modification is that the frequency bands may become forbidden, i.e. no longer allow the wave to propagate.

The greater the contrasts of the periodic structure in acoustic terms (acoustic impedance), the wider the forbidden bands. To obtain an absolute forbidden band, i.e. in all directions, it is desirable to have a three-dimensional periodicity and therefore a three-dimensional medium. In the present embodiments, the propagation takes place in a layer. It is therefore possible to produce a structure having a two-dimensional periodicity which inhibits propagation in generally all the directions of the plane of the layer.

According to the embodiments, adding a periodic structure makes it possible to increase the acoustic impedance of the substrate viewed by the device by creating locally periodic propagation properties, i.e. of a reflector similar to a Bragg reflector. The periodic structure makes it possible to return the acoustic wave to the vibratile structure. Due to this effect, the quality coefficient of the resonator, corresponding to the ratio between the vibratory energy stored in the resonator and the energy dissipated (particularly by acoustic radiation in the substrate) during a cycle increases.

The periodic structure may be located in the vicinity of the junction between the vibratile structure and the anchoring structure. The structural features of the periodic structure may be determined as a function of the natural frequency fp of the vibratile structure. The periodic structure may be dimensioned as $\lambda/4$, where $\lambda$ is the wavelength corresponding to the propagation rate of the acoustic wave in the periodic structure for the resonant frequency fp. For example, the propagation rate may be calculated in each of the zones of the periodic structure, the resonant frequency being known, and the respective wavelengths $\lambda$ are deduced.

In another embodiment, the periodic structure may not be dimensioned as $\lambda/4$, for example, when it may be desirable to filter several waves having different wavelengths A. For example, for some Bragg reflectors used for bulk acoustic waves (BAWs), it may be desirable to make a compromise, and it may be advantageous to use periodic structures having irregular dimensions, different from $\lambda/4$.

The number of periods included by the periodic structure is, for example, determined by a computer simulation and optimized by in situ tests, and also depends on the space available in the integrated circuit including the device. The device may naturally include several periodic structures. In particular, the device may advantageously include one periodic structure per connector.

Figure 2A:
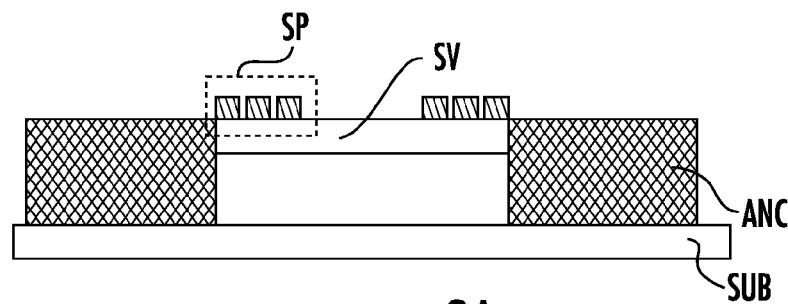
FIG. 2a is a cross-section of an embodiment of the device according to the invention.
Figure 2B:
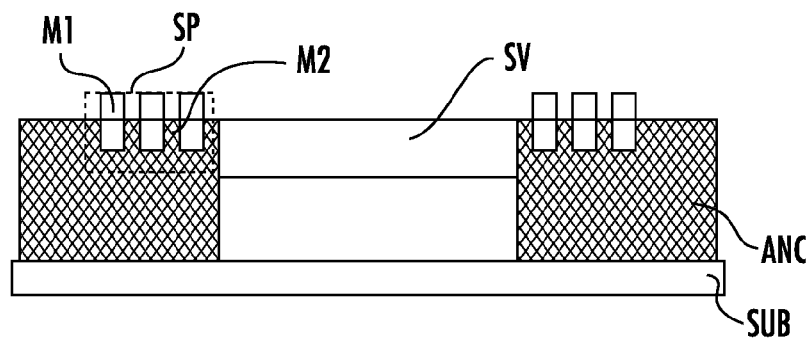
FIG. 2b is a cross-section of another embodiment of the device according to the invention.
Figure 3:
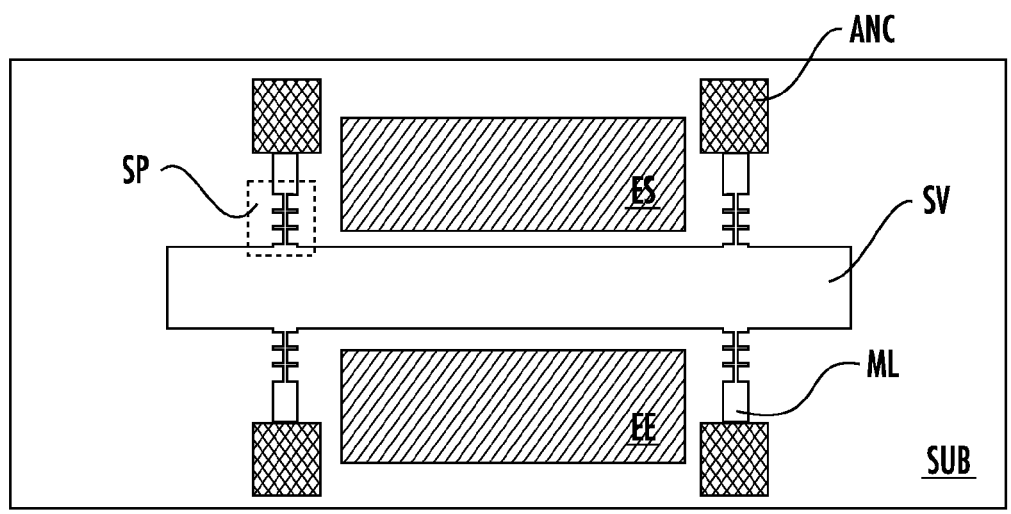
FIG. 3 is a top view of another embodiment of the device according to the invention.

In a first embodiment, the periodic structure is produced by periodic etching, for example, in the form of grooves, on at least one surface of the structure in question (vibratile and/or anchoring), as illustrated in FIG. 2b and FIG. 3. In FIG. 2b, where the input and output electrodes are not shown, the periodic structure SP is produced by periodic etching of the anchoring structure (anchor), according to grooves parallel with each other, and perpendicular to the longitudinal axis of the vibratile structure SV. The structure vibrates according to a vertical mode, and each end may be directly connected to an anchor ANC fixed to the substrate SUB.

FIG. 3 illustrates another embodiment of the embodiment in FIG. 1. The periodic structure is produced on the connector. In this instance, each connector between an anchor ANC fixed to the substrate SUB and the vibratile structure SV is equipped with a periodic structure SP. In operation, the acoustic wave generated by the lateral vibration of the vibratile structure SV between the input electrode EE and the output electrode ES is reflected by each periodic structure.

In a second embodiment, the periodic structure is produced by adding material, i.e. by periodic deposition of material, as shown in FIG. 2a. In FIG. 2a, the periodic structure SP is produced by depositing material on the vibratile structure SV. The structure vibrates according to a vertical mode, and each end may be connected to an anchor ANC fixed to the substrate SUB. The material deposited may be different to that forming the vibratile device, or the material of the anchoring structure. The deposition of material for the production of the periodic structure includes, for example, silicon nitride, a silicon oxide, or a metal, such as gold, aluminium, tungsten, copper, or molybdenum. Advantageously, the deposited metal has a low electrical resistivity. The deposition material may be deposited, for example, by a chemical vapor deposition (CVD) method. The thickness of a zone of the periodic structure may be different to that of the vibratile structure and/or the anchoring structure and/or that of the other zone(s) of the periodic structure.

In a third embodiment, the periodic structure is produced by adding material and periodic etching. In a first configuration, the vibratile structure SV is a beam type elongated structure. In a first vibration mode, the beam vibrates on a lateral mode, between the input electrode EE and the output electrode ES, as represented by a double arrow in FIG. 1.

In this embodiment, wherein FIG. 1 is a top view, the beam is connected to the substrate SUB in each of the ends thereof by an anchor ANC positioned along the longitudinal axis. The periodic structures SP each connect anchors to each of the ends of the beam. Each zone of the periodic structure is generally perpendicular to the longitudinal axis of the beam. Each zone of each periodic structure may have an axis of symmetry merged with the longitudinal axis, i.e. the axis of symmetry of the beam. This advantageous arrangement makes it possible to configure the device such that the incidence of the acoustic wave is generally parallel with respect to the direction of periodicity of the structure.

The periodic structure includes a first zone M1 and a second zone M2. Advantageously, the length P2 of one of the zones is at least equal to the width of the beam. By this configuration, the wave front of the acoustic wave propagating in the vibratile structure (or in the anchoring structure) is generally perpendicular to the direction of periodicity of the periodic structure, and is reflected in phase or in antiphase, as a function of the nature of the periodic structure.

In other embodiments (not shown), the first zone M1 may be a part of the beam itself and/or the anchoring structure. The respective widths L1 and L2 of the zones M1 and M2 may be dimensioned as $\lambda/4$, the respective lengths P1 and P2 of the zones M1 and M2, making it possible to set the acoustic impedances.

Advantageously, the periodic structure is produced in the same material as that of the vibratile structure, which simplifies the manufacturing techniques. The thickness of each of the zones of the periodic structure may be different to that of the vibratile structure. The thicknesses may be equal. All or part of the device according to the embodiments may be produced using conventional masking techniques.

FIG. 3 illustrates, also in a lateral vibration mode, an embodiment of the anchoring structure, and the positioning of the periodic structure. The anchoring structure includes four anchors ANC fixed in the substrate SUB in pairs on either side of two vibration nodes of the beam SV. Four connectors ML each connect one anchor to a vibration node of the beam. The electrodes are also located on either side of the beam between the vibration nodes.

In a second embodiment, the beam vibrates on a vertical mode. The beam may, for example, be connected to the substrate by an attachment point, or two attachment points, as illustrated in FIGS. 2a and 2b, wherein the input and output electrodes are not shown.

In a third vibration mode (not shown), the beam vibrates in torsion about the longitudinal axis thereof. In a fourth vibration mode (not shown), the beam vibrates in compression/extension, for example along the longitudinal axis thereof.

In a second configuration (not shown), the vibratile structure is a disk type structure vibrating according to a radial mode, i.e. the propagation of the acoustic wave takes place in concentric circles. In this embodiment, the periodic structure may be concentric with the disk and advantageously has a revolution symmetry. In this configuration, the disk may be connected to the substrate by a rod passing through the center of the disk. The periodic structure may be, in this case, advantageously located in the vicinity of the center of the disk.

The electrodes are arranged symmetrically with respect to a diameter of the disk. The anchoring structure includes an anchor fixed in the substrate and a connector, such as a rod, connecting the anchor to the center of the disk.

The device according to the embodiments may be implemented, irrespective of the configuration, in a beam, a disk or other form, and irrespective of the vibration mode, lateral, vertical or other. Due to the viscous damping of the vibration in air, it may be possible to provide vacuum encapsulation of the device according to the embodiments. The device according to the embodiments may be advantageously used for the manufacture of electronic components, having an electric resonance having the same natural frequency fp.

That which is claimed:

1. A micro-electromechanical resonance (MEMS) device comprising:
   a substrate;
   an input electrode to be coupled to an alternating current source;
   an output electrode;
   at least one anchoring structure coupled to said substrate; and
   a vibratile structure coupled to said at least one anchoring structure by at least one junction positioned on a vibration node;
   said vibratile structure having a natural acoustic resonant frequency so that a vibration generated when the input electrode is powered, generates an alternating current on the output electrode, the alternating current having an output frequency based upon the natural acoustic resonant frequency;
   at least one of said vibratile structure and said anchoring structure comprising a periodic structure;
   said periodic structure comprising at least first and second zones different from each other, each of the first and second zones respectively having different first and second acoustic propagation properties.

2. The device according to claim 1 wherein said periodic structure comprises a material different from at least one other material of said vibratile structure and said at least one anchoring structure.

3. The device according to claim 1 wherein said at least one anchoring structure comprises at least one anchor being fixed in said substrate and at least one connector to connect said at least one anchor to said vibratile structure.

4. The device according to claim 1 wherein said periodic structure is positioned adjacent the at least one junction.

5. The device according to claim 1 wherein said periodic structure has dimensions of $\lambda/4$, where $\lambda$ is a wavelength corresponding to a propagation rate of an acoustic wave in said periodic structure at the resonant frequency.

6. The device according to claim 1 wherein said vibratile structure further comprises at least one of a beam to vibrate according to at least one of a lateral, vertical, torsion and extension mode.

7. The device according to claim 1 wherein said vibratile structure further comprises a disk coupled at a center thereof to said anchoring structure; said periodic structure being concentric with a center of the disk.

8. The device according to claim 1 wherein said periodic structure has a direction of periodicity arranged parallel with a direction of propagation of an acoustic wave in at least one of said vibratile structure and said anchoring structure.

9. A micro-electromechanical resonance (MEMS) device comprising:
   a substrate;
   at least one anchoring structure coupled to said substrate; and
   a vibratile structure coupled to said at least one anchoring structure by at least one junction positioned on a vibration node;
   said vibratile structure having a natural acoustic resonant frequency so that a vibration generates an alternating current having an output frequency based upon the natural acoustic resonant frequency;
   said vibratile structure comprising a periodic structure;
   said periodic structure comprising at least first and second zones different from each other, each of the first and second zones respectively having different first and second acoustic propagation properties.

10. The device according to claim 9 wherein said periodic structure comprises a material different from at least one other material of said vibratile structure and said at least one anchoring structure.

11. The device according to claim 9 wherein said periodic structure has dimensions of $\lambda/4$, where $\lambda$ is a wavelength corresponding to a propagation rate of an acoustic wave in said periodic structure at the resonant frequency.

12. The device according to claim 9 wherein said periodic structure has a direction of periodicity arranged parallel with a direction of propagation of an acoustic wave in at least one of said vibratile structure and said anchoring structure.

13. A micro-electromechanical resonance (MEMS) device comprising:
   a substrate;
   at least one anchoring structure coupled to said substrate; and
   a vibratile structure coupled to said at least one anchoring structure by at least one junction positioned on a vibration node;
   said vibratile structure having a natural acoustic resonant frequency, and generating an alternating current having an output frequency based upon the natural acoustic resonant frequency;
   said anchoring structure comprising a periodic structure;
   said periodic structure comprising at least first and second zones different from each other, each of the first and second zones respectively having different first and second acoustic propagation properties.

14. The device according to claim 13 wherein said periodic structure comprises a material different from at least one other material of said vibratile structure and said at least one anchoring structure.

15. The device according to claim 13 wherein said periodic structure is positioned adjacent the at least one junction.

16. The device according to claim 13 wherein said periodic structure has a direction of periodicity arranged parallel with a direction of propagation of an acoustic wave in at least one of said vibratile structure and said anchoring structure.

17. A method of making micro-electromechanical resonance (MEMS) device comprising:
   forming a substrate;
   coupling at least one anchoring structure to the substrate; and
   coupling a vibratile structure to the at least one anchoring structure by at least one junction positioned on a vibration node;
   the vibratile structure having a natural acoustic resonant frequency so that a vibration generates an alternating current having an output frequency based upon the natural acoustic resonant frequency;
   the vibratile structure comprising a periodic structure;
   the periodic structure comprising at least first and second zones different from each other, each of the first and second zones respectively having different first and second acoustic propagation properties.

18. The method according to claim 17 wherein the periodic structure comprises a material different from at least one other material of said vibratile structure and said at least one anchoring structure.

19. The method according to claim 17 further comprising positioning the periodic structure adjacent the at least one junction.

20. The method according to claim 17 wherein the periodic structure has dimensions of $\lambda/4$, where $\lambda$ is a wavelength corresponding to a propagation rate of an acoustic wave in the periodic structure at the resonant frequency.

21. The method according to claim 17 wherein the periodic structure has a direction of periodicity arranged parallel with a direction of propagation of an acoustic wave in at least one of the vibratile structure and the anchoring structure.

22. A method of making a micro-electromechanical resonance (MEMS) method comprising:
   forming a substrate;
   coupling at least one anchoring structure to the substrate; and
   coupling a vibratile structure to the at least one anchoring structure by at least one junction positioned on a vibration node;
   the vibratile structure having a natural acoustic resonant frequency so that a vibration generates an alternating current having an output frequency based upon the natural acoustic resonant frequency;
   the anchoring structure comprising a periodic structure;
   the periodic structure comprising at least first and second zones different from each other, each of the first and second zones respectively having different first and second acoustic propagation properties.

23. The method according to claim 22 wherein the periodic structure comprises a material different from at least one other material of said vibratile structure and said at least one anchoring structure.

24. The method according to claim 22 further comprising positioning the periodic structure adjacent the at least one junction.

25. The method according to claim 22 wherein the periodic structure has dimensions of $\lambda/4$, where $\lambda$ is a wavelength corresponding to a propagation rate of an acoustic wave in the periodic structure at the resonant frequency.

26. The method according to claim 22 wherein the periodic structure has a direction of periodicity arranged parallel with a direction of propagation of an acoustic wave in at least one of said vibratile structure and said anchoring structure.

* * * * *